United States Patent
Havel

(10) Patent No.: US 6,239,776 B1
(45) Date of Patent: May 29, 2001

(54) MULTICOLOR MULTI-ELEMENT DISPLAY SYSTEM

(75) Inventor: Karel Havel, Bramalea (CA)

(73) Assignee: Texas Digital Systems, Inc.

( * ) Notice: Subject to any disclaimer, the term of this patent is extended or adjusted under 35 U.S.C. 154(b) by 0 days.

(21) Appl. No.: 09/073,393

(22) Filed: May 5, 1998

Related U.S. Application Data

(62) Division of application No. 08/910,080, filed on Aug. 12, 1997, now Pat. No. 6,018,237, which is a division of application No. 08/571,246, filed on Dec. 12, 1995, now Pat. No. 5,656,935, which is a division of application No. 08/187,350, filed on Jan. 27, 1994, now Pat. No. 5,475,300, which is a division of application No. 07/865,460, filed on Apr. 9, 1992, now Pat. No. 5,283,517, which is a division of application No. 07/628,328, filed on Dec. 14, 1990, now Pat. No. 5,122,733, which is a division of application No. 07/197,322, filed on May 23, 1988, now abandoned, which is a division of application No. 06/819,111, filed on Jan. 15, 1986, now Pat. No. 4,794,383.

(51) Int. Cl.[7] .................................................. G09G 3/32
(52) U.S. Cl. ................. 345/83; 345/150; 345/34; 345/46; 345/48; 345/39; 324/115
(58) Field of Search ................... 345/83, 150, 151, 345/152, 34, 39, 44, 82, 114, 155, 46, 48; 324/115; 313/510

(56) References Cited

U.S. PATENT DOCUMENTS

| 2,643,344 | 6/1953 | McLaren et al. . |
|---|---|---|
| 2,648,015 | 8/1953 | Greenfield et al. . |

(List continued on next page.)

FOREIGN PATENT DOCUMENTS

| 3037-500 | 4/1981 | (DE) . |
|---|---|---|
| 3009416 | 9/1981 | (DE) . |
| 220844A | 4/1985 | (DE) . |
| 2158631A | 10/1985 | (GB) . |
| 57-146112 | 9/1982 | (JP) . |

OTHER PUBLICATIONS

SenSym Solid State Barometers Catalog, pp. 9–30, 1983.
Landauer, R. W., "Electroluminescent Display", IBM Technical Disclosure Bulletin, vol. 8, No. 1, pp. 15–16, Apr. 11, 1966.
Wagner, B., "2–Color LED + Driver=Versatile Visual Effects", EDN vol. 25, No. 19, Oct. 20, 1980.
Smithline, L.M., "Dual light emitting diode synthesizes polychromatic light", Electronics, Aug. 16, 1979, p. 130.
Svestka, M. et al, "LED's change color to indicate balance voltage", Electronic Engineering, vol. 48, No. 576, p. 19, Feb. 1976.
Saitoh, T. et al. "Multi–color light emitting diodes with double junction structure". IEEE Transactions on Electron Devices, Feb. 1975, vol. ED–22, No. 2, pp. 29–32.
Yamaguchi, T. et al, "a High Brightness Gap Multicolor LED", IEEE Transactions on Electron Devices, vol. ED–28, No. 5, May 1981, pp. 588–592.
Baker, M., "Chip changes the color of light emitting diodes", Electronics, Apr. 7, 1981, pp. 158–159.
Rao, V., Two LED's blend and blink to indicate six states. Electronic Design, vol. 30, No. 16, p. 220, Aug. 5, 1982.

(List continued on next page.)

Primary Examiner—Richard Hjerpe
Assistant Examiner—Ali Zamam
(74) Attorney, Agent, or Firm—Winstead Sechrest & Minick

(57) ABSTRACT

A multicolor multi-element display system includes a plurality of multicolor display elements, each having color control inputs for controlling its color and an enable input for controlling its condition. The color control signals are commonly presented to the interconnected color control inputs of all display elements. The individual display elements are independently illuminated or extinguished by enable control signals presented to their enable inputs.

6 Claims, 4 Drawing Sheets

U.S. PATENT DOCUMENTS

| | | |
|---|---|---|
| 2,682,000 | 6/1954 | Clayton et al. . |
| 2,878,450 | 3/1959 | Rabier . |
| 2,889,518 | 6/1959 | Hudson et al. . |
| 3,595,991 | 7/1971 | Diller . |
| 3,696,393 * | 10/1972 | McDonald ............ 340/166 |
| 3,719,849 | 3/1973 | Steward . |
| 3,740,570 | 6/1973 | Kaelin et al. ............ 307/40 |
| 3,760,174 | 9/1973 | Boenning et al. ........ 240/1 R |
| 3,771,155 | 11/1973 | Hayashi et al. . |
| 3,840,873 | 10/1974 | Usui . |
| 3,873,979 | 3/1975 | Craford et al. . |
| 3,911,418 | 10/1975 | Takeda . |
| 3,924,227 | 12/1975 | Stolov ................... 340/336 |
| 3,975,726 | 8/1976 | Kawakami ............ 340/336 |
| 4,005,404 | 1/1977 | Soobik .................. 340/336 |
| 4,086,514 | 4/1978 | Havel . |
| 4,271,408 | 6/1981 | Teshima et al. . |
| 4,301,450 | 11/1981 | Smoliar . |
| 4,360,804 | 11/1982 | Ohura . |
| 4,488,149 | 12/1984 | Givens, Jr. ............ 340/762 |
| 4,559,480 | 12/1985 | Nobs ..................... 315/324 |
| 4,581,612 | 4/1986 | Jones . |
| 4,647,217 | 3/1987 | Havel . |
| 4,689,613 | 8/1987 | Ikeda . |
| 4,709,230 | 11/1987 | Popowski et al. . |
| 4,712,099 | 12/1987 | Maeda . |
| 4,725,828 | 2/1988 | Cowlishaw . |
| 4,740,818 | 4/1988 | Tsilibes et al. ............ 355/14 R |
| 4,771,274 | 9/1988 | Havel . |
| 4,831,326 | 5/1989 | Havel . |
| 5,003,298 | 3/1991 | Havel . |
| 5,134,387 * | 7/1992 | Smith et al. ............ 345/83 |
| 5,767,837 * | 6/1998 | Hara ........................ 345/15 |
| 5,821,911 * | 10/1998 | Jachimowicz ............ 345/83 |
| 6,018,237 * | 1/2000 | Havel ..................... 345/150 |

OTHER PUBLICATIONS

Kojima, T. "Recent flat panel development in Japan", held in San Diego, CA, Apr. 29–May 1, 1980. SID 80 Digest, pp. 22–23.

Niina, T. et al, "A multi–color GaP LED flat panel display device" Held New York, NY, USA, Apr. 28–30, 1981. 1981 SID International Symposium Digest of Papers, vol. XII (1981), pp. 140–141.

Niina, T. et al, "A multi–color LED flat panel display device for colorful displays of letters and figures". Proceedings of the SID, vol. 23, No. 2, pp. 73–76, 1982.

O'Mara, P.A. et al, "Microprocessor–controlled light emitting diode dark adaptometer". Medical & Biological Engineering and Computing, vol. 20, No. 1, pp. 70–76, 1982.

* cited by examiner

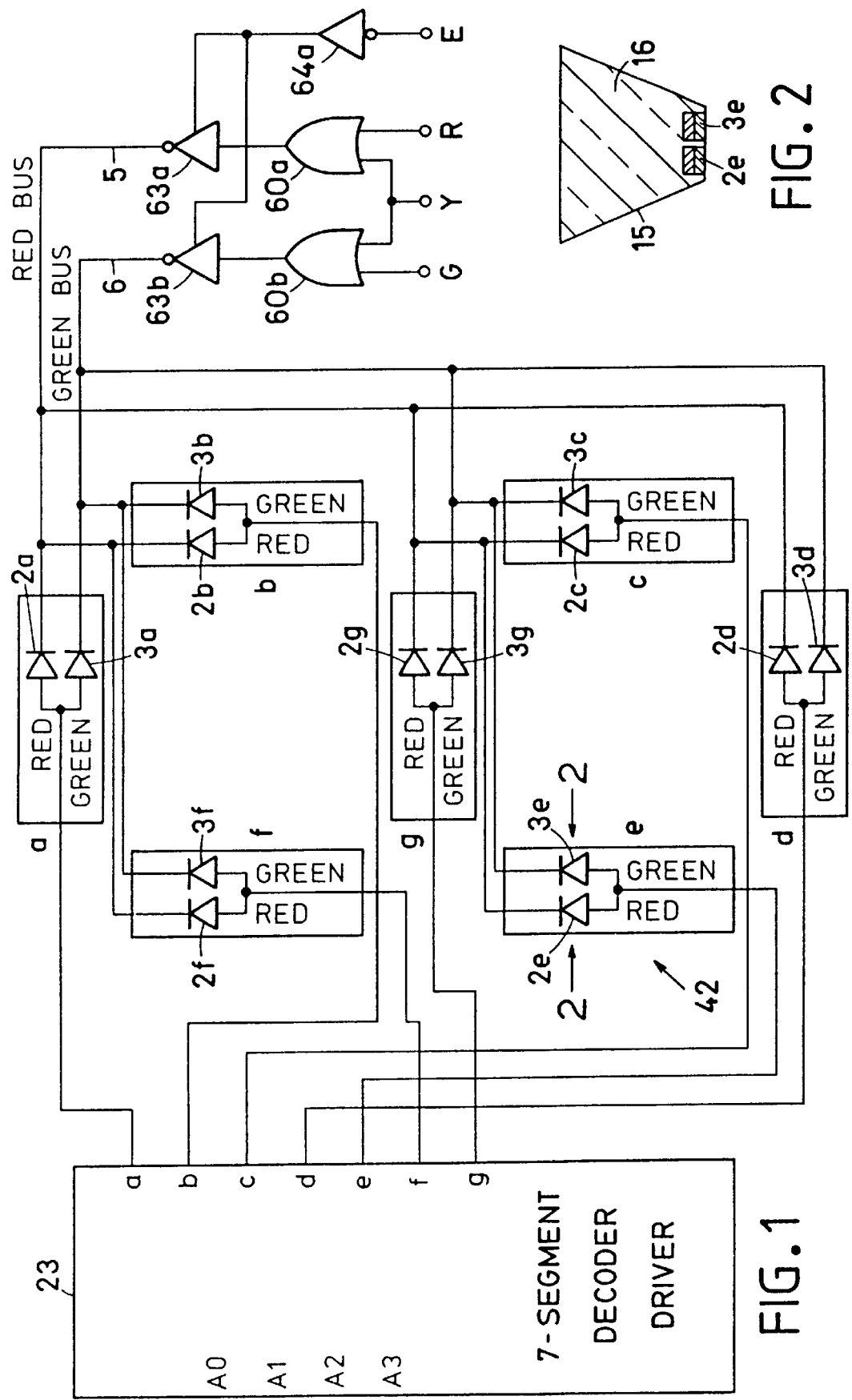

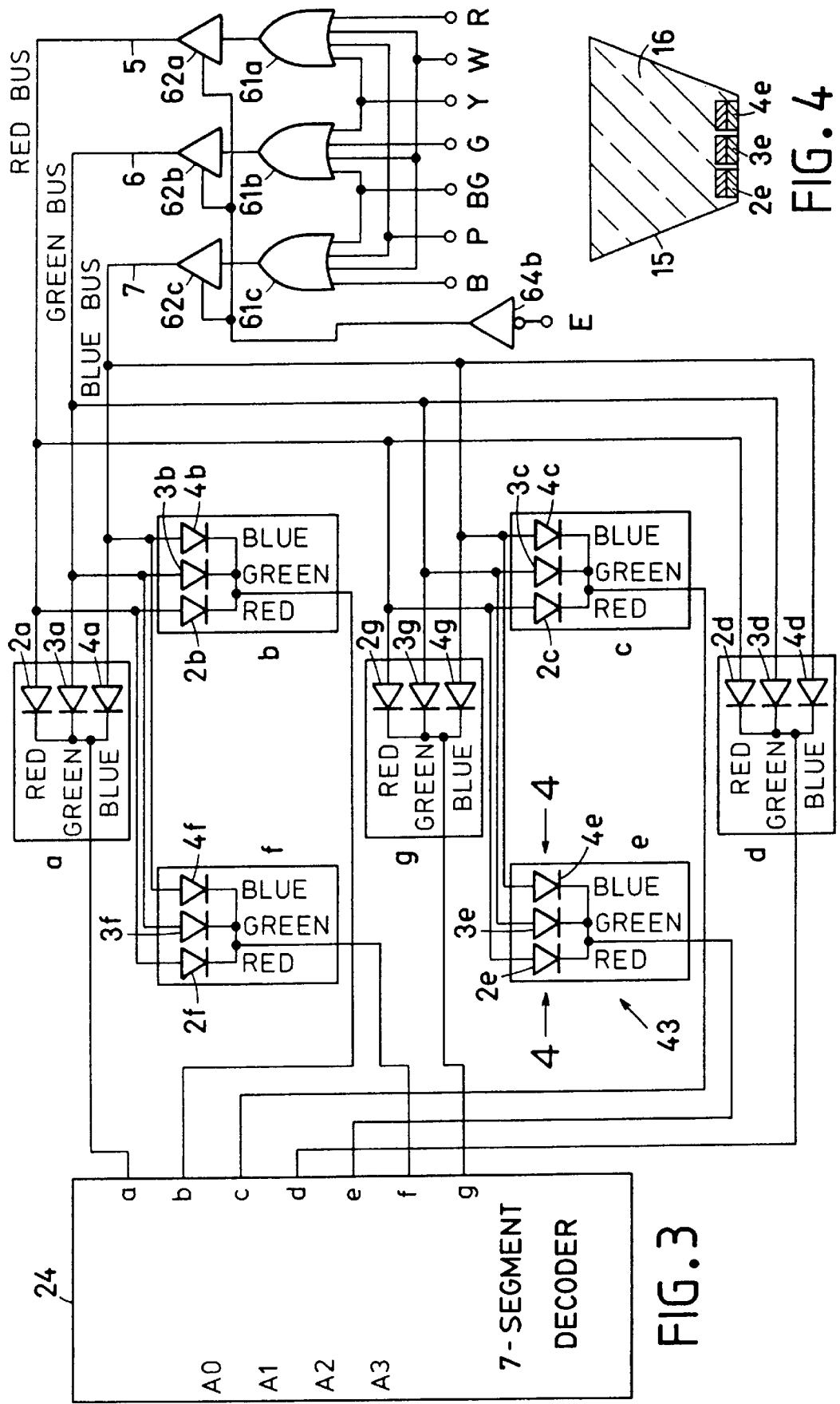

US 6,239,776 B1

MULTICOLOR MULTI-ELEMENT DISPLAY SYSTEM

CROSS-REFERRENCE TO RELATED APPLICATIONS

This is a division of my application Ser. No. 08/910,080, filed on Aug. 12, 1997, entitled Variable Color Display System, now U.S. Pat. No. 6,018,237 which is a division of my application Ser. No. 08/571,246, filed on Dec. 12, 1995, entitled Variable Color Display System, now U.S. Pat. No. 5,656,935 issued on Aug. 12, 1997, which is a division of my application Ser. No. 08/187,350, filed on Jan. 27, 1994, entitled Variable Color Digital Multimeter, now U.S. Pat. No. 5,475,300 issued on Dec. 12, 1995, which is a division of my application Ser. No. 07/865,460, filed on Apr. 9, 1992, entitled Variable Color Digital Multimeter, now U.S. Pat. No. 5,283,517 issued on Feb. 1, 1994, which is a division of my application Ser. No. 07/628,328, filed on Dec. 14, 1990, entitled Variable Color Digital Multimeter, now U.S. Pat. No. 5,122,733 issued on Jun. 16, 1992, which is a division of my application Ser. No. 07/197,322, filed on May 23, 1988, entitled Variable Color Digital Multimeter, now abandoned, which is a division of my application Ser. No. 06/819,111, filed on Jan. 15, 1986, entitled Variable Color Digital Multimeter, now U.S. Pat. No. 4,794,383 issued on Dec. 27, 1988.

Reference is also made to my related applications Ser. No. 06/817,114, filed on Jan. 8, 1986, entitled Variable Color Digital Timepiece, now U.S. Pat. No. 4,647,217 issued on Mar. 3, 1987, Ser. No. 06/839,526, filed on Mar. 14, 1986, entitled Variable Color Display Telephone, now U.S. Pat. No. 4,726,059 issued on Feb. 16, 1988, Ser. No. 06/940/100, filed on Dec. 10, 1986, entitled Digital Voltmeter with Variable Color Background, now U.S. Pat. No. 4,831,326 issued on May 16, 1989, Ser. No. 06/922,847, filed on Oct. 24, 1986, entitled Continuously Variable Color Display Device, now U.S. Pat. No. 4,845,481 issued on Jul. 4, 1989, Ser. No. 07/322,341, filed on Mar. 13, 1989, entitled Continuously Variable Color Optical Device, now U.S. Pat. No. 4,965,561 issued on Oct. 23, 1990, Ser. No. 06/920,740, filed on Oct. 20, 1986, entitled Step Variable Color Display Device, now abandoned, Ser. No. 06/931,626, filed on Nov. 17, 1986, entitled Variable Color Hybrid Display Device, now abandoned, and Ser. No. 07/157,603, filed on Feb. 19, 1988, entitled Variable Color Multiplexed Display System, now abandoned, which describe devices employing a multicolor color display.

BACKGROUND OF THE INVENTION

1. Field of the Invention

This invention relates to multicolor display devices utilizing light emitting diodes.

2. Description of the Prior Art

An electronic display having segments wherein each segment is capable of selectively illuminating two colors is disclosed in U.S. Pat. No. 4,488,149 issued on Dec. 11, 1984 to William A. Givens, Jr. Two AND gates are provided for biasing, in each display segment, either a first light emitting diode, for emitting a first color, or a second light emitting diode, for emitting a second color. It is not contemplated to illuminate both light emitting diodes in each segment simultaneously for blending the colors. A multi-element display is not contemplated.

A driving circuit for light emitting diodes, disclosed in U.S. Pat. No. 3,740,570, issued on Jun. 19, 1973 to George R. Kaelin et al., uses special light emitting diodes which emit different color light in response to different currents. The driving circuit selects either a relatively high current for green display, or a relatively low current for red display, or an intermediate current for yellow display, by selectively applying pulses of different amplitudes to the light emitting diodes. The display device is not capable of producing other colors. It is not contemplated that light signals of primary colors may be blended.

SUMMARY OF THE INVENTION

It is the principal object of this invention to provide an improved multicolor display device.

It is another object of the invention to provide a multi-element multicolor display system using two primary color LEDs.

It is still another object of the invention to provide a multi-element multicolor display system using three primary color LEDs.

It is still another object of the invention to provide a multi-element multicolor display system having a plurality of color control inputs which are respectively interconnected.

It is still another object of the invention to provide a multicolor display device having an enable control input.

It is still another object of the invention to provide a multi-element multicolor display system in which the color control signals may be presented to all display elements simultaneously, and the enable control signal determines which display element illuminates.

Other objects of the invention will be obvious from the appended drawings and their description.

In summary, a multi-element display system of the invention includes a plurality of multicolor light emitting diode display elements, each display element having a plurality of color control inputs and an enable input. The like color control inputs of all display elements are interconnected.

The invention resides in commonly presenting the color control signals to the interconnected color control inputs of all display elements, and in individually controlling the display elements by their enable inputs, either to extinguish them or to illuminate them in a color in accordance with the color control signals.

BRIEF DESCRIPTION OF THE DRAWINGS

In the drawings in which are shown the preferred embodiments of the invention,

FIG. 1 is a schematic diagram of a single 2-primary color 7-segment display element.

FIG. 2 is an enlarged cross-sectional view of one display segment in FIG. 1, taken along the line 2—2.

FIG. 3 is a schematic diagram of a single 3-primary color 7-segment display element.

FIG. 4 is an enlarged cross-sectional view of one display segment in FIG. 3, taken along the line 4—4.

Throughout the drawings, like characters indicate like parts.

DESCRIPTION OF THE PREFERRED EMBODIMENTS

Figure 5:
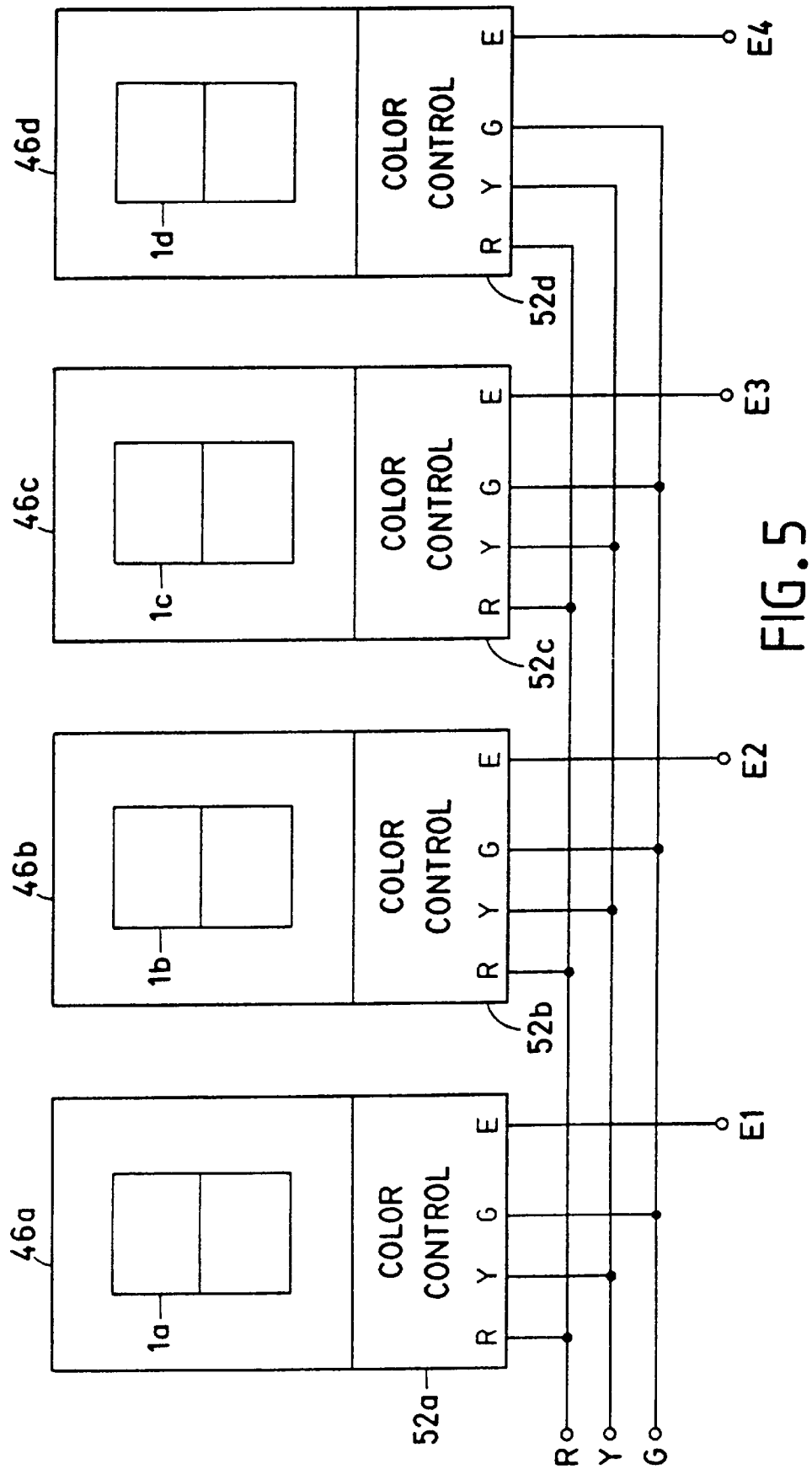
FIG. 5 is a block diagram of a 2-primary color multicolor 4-digit display.

Referring now, more particularly, to the drawings, in FIG. 1 is shown a schematic diagram of a 2-primary color common cathodes 7-segment display element 42 which can selectively display various digital fonts in different colors on display segments a, b, c, d, e, f, and g. Each display segment includes a pair of LEDs (light emitting diodes): red LED 2 and green LED 3, which are closely adjacent such that the light signals emitted therefrom are substantially superimposed upon each other to mix the colors. To facilitate the illustration, the LEDs are designated by segment symbols, e. g., the red LED in the segment a is designated as 2*a*, etc.

The anodes of all red and green LED pairs are interconnected in each display segment and are electrically connected to respective outputs of a commercially well known common-cathode 7-segment decoder 23. The cathodes of all red LEDs 2*a*, 2*b*, 2*c*, 2*d*, 2*e*, 2*f*, and 2*g* are interconnected to a common electric path referred to as a red bus 5. The cathodes of all green LEDs 3*a*, 3*b*, 3*c*, 3*d*, 3*e*, 3*f*, and 3*g* are interconnected to a like common electric path referred to as a green bus 6.

The red bus 5 is connected to the output of a tri-state inverting buffer 63*a*, capable of sinking sufficient current to forwardly bias all red LEDs 2*a* to 2*g* in display element 42. The green bus 6 is connected to the output of a like buffer 63*b*. The conditions of red bus 5 and green bus 6 can be controlled by applying valid combinations of logic level control signals to color control inputs R (red), Y (yellow), and G (green), to illuminate display element 42 in a selected color.

The tri-state inverting buffers 63*a* and 63*b* can be simultaneously enabled by applying a logic low level signal to the input E of an inverter 64*a*, and disabled by applying a logic high level signal therein. When both tri-state inverting buffers 63*a* and 63*b* are enabled, the conditions of red bus 5 and green bus 6 can be selectively controlled by applying valid combinations of logic level signals to color control inputs R, Y, and G, for illuminating display element 42 in a selected color. When both tri-state inverting buffers 63*a* and 63*b* are disabled, both buses are effectively disconnected, and display element 42 is extinguished.

The color control inputs R, Y, G are applied to the inputs of two 2-input OR gates 60*a*, 60*b*, whose outputs respectively drive inverting buffers 63*a*, 63*b*. Color control R is applied directly to the input of OR gate 60*a*. In a similar fashion, color control input G is applied directly to the input of OR gate 60*b*. However, color control input Y is applied simultaneously to the inputs of both OR gates 60*a*, 60*b*.

The operation of display element 42 will be now explained by the example of illuminating a digit '7' in three different colors. Any digit between 0 and 9 can be selectively displayed by applying the appropriate BCD code to the inputs A0, A1, A2 and A3 of common-cathode 7-segment decoder 23. The decoder 23 develops at its outputs a, b, c, d, e, f, and g drive signals for energizing selected groups of the segments to visually display the selected number, in a manner well known to those skilled in the art. To display decimal number '7', a BCD code 0111 is applied to the inputs A0, A1, A2 and A3. The decoder 23 develops high voltage levels at its outputs a, b, and c, to illuminate equally designated segments a, b, and c, and low voltage levels at all remaining outputs (not shown), to extinguish all remaining segments d, e, f, and g.

To illuminate display element 42 in red color, color control input R is raised to a high logic level, and color control inputs Y and G are maintained at a low logic level. As a result, the output of OR gate 60*a* rises to a high logic level, thereby causing the output of buffer 63*a* to drop to a low logic level. The current flows from the output a of decoder 23, via red LED 2*a* and red bus 5, to current sinking output of buffer 63*a*. Similarly, the current flows from the output b of decoder 23, via red LED 2*b* and red bus 5, to the output of buffer 63*a*. The current flows from the output c of decoder 23, via red LED 2*c* and red bus 5, to the output of buffer 63*a*. As a result, segments a, b, and c illuminate in red color, thereby causing a visual impression of a character '7'. The green LEDs 3*a*, 3*b*, and 3*c* remain extinguished because the output of buffer 63*b* is at a high logic level, thereby disabling green bus 6.

To illuminate display element 42 in green color, color control input G is raised to a high logic level, while color control inputs R and Y are maintained at a low logic level. As a result, the output of OR gate 60*b* rises to a high logic level, thereby causing the output of buffer 63*b* to drop to a low logic level. The current flows from the output a of decoder 23, via green LED 3*a* and green bus 6, to current sinking output of buffer 63*b*. Similarly, the current flows from the output b of decoder 23, via green LED 3*b* and green bus 6, to the output of buffer 63*b*. The current flows from the output c of decoder 23, via green LED 3*c* and green bus 6, to the output of buffer 63*b*. As a result, segments a, b, and c illuminate in green color. The red LEDs 2*a*, 2*b*, and 2*c* remain extinguished because the output of buffer 63*a* is at a high logic level, thereby disabling red bus 5.

To illuminate display element 42 in yellow color, color control input Y is raised to a high logic level, while color inputs R and G are maintained at a low logic level. As a result, the outputs of both OR gates 60*a* and 60*b* rise to a high logic level, thereby causing the outputs of both buffers 63*a* and 63*b* to drop to a low logic level. The current flows from the output a of decoder 23, via red LED 2*a* and red bus 5, to current sinking output of buffer 63*a*, and, via green LED 3*a* and green bus 6, to current sinking output of buffer 63*b*. Similarly, the current flows from the output b of decoder 23, via red LED 2*b* and red bus 5, to the output of buffer 63*a*, and, via green LED 3*b* and green bus 6, to the output of buffer 63*b*. The current flows from the output c of decoder 23, via red LED 2*c* and red bus 5, to the output of buffer 63*a*, and, via green LED 3*c* and green bus 6, to the output of buffer 63*b*. As a result of blending light of red and green colors in each segment, segments a, b, and c illuminate in substantially yellow color.

In FIG. 2, red LED 2*e* and green LED 3*e* are placed on the base of a segment body 15 which is filled with a transparent light scattering material 16. When forwardly biased, LEDs 2*e* and 3*e* emit light signals of red and green colors, respectively, which are scattered within transparent material 16, thereby blending the red and green light signals into a composite light signal that emerges at the upper surface of segment body 15. The color of the composite light signal may be controlled by varying the portions of the red and green light signals.

In FIG. 3 is shown a schematic diagram of a one-character 3-primary color common anodes 7-segment display element 43 which can selectively display digital fonts in different colors. Each display segment a, b, c, d, e, f, and g includes a triad of LEDs: red LED 2, green LED 3, and blue LED 4, which are closely adjacent such that the light signals emitted therefrom are substantially superimposed upon one another to mix the colors.

The cathodes of all red, green, and blue LED triads in each display segment a, b, c, d, e, f, and g are interconnected and electrically connected to respective outputs of a commercially well known common anode 7-segment decoder 24. The anodes of all red LEDs 2*a*, 2*b*, 2*c*, 2*d*, 2*e*, 2*f*, and 2*g* are interconnected to form a common electric path referred to as red bus 5. The anodes of all green LEDs 3a, 3b, 3c, 3d, 3e, 3f, and 3g are interconnected to form a like common electric path referred to as green bus 6. The anodes of all blue LEDs 4a, 4b, 4c, 4d, 4e, 4f, and 4g are interconnected to form a like common electric path referred to as blue bus 7.

The red bus 5 is connected to the output of a tri-state non-inverting buffer 62a, capable of sourcing sufficient current to illuminate all red LEDs in display element 43. The green bus 6 is connected to the output of a like tri-state non-inverting buffer 62b. The blue bus 7 is connected to the output of a like tri-state non-inverting buffer 62c. The conditions of red bus 5, green bus 6, and blue bus 7 can be selectively controlled by applying valid combinations of logic level signals to color control inputs B (Blue), P (Purple), BG (Blue-Green), G (Green), Y (Yellow), W (White), and R (Red).

The tri-state non-inverting buffers 62a, 62b, and 62c can be simultaneously enabled by applying a logic low level signal to the input E of an inverter 64b, and disabled by applying a logic high level signal therein. When all tri-state non-inverting buffers 62a, 62b, and 62c are enabled, the conditions of red bus 5, green bus 6, and blue bus 7 can be selectively controlled by applying valid combinations of logic level signals to color control inputs B, P, BG, G, Y, W, and R, for illuminating display element 43 in a selected color. When all tri-state non-inverting buffers 62a, 62b, and 62c are disabled, all three buses are effectively disconnected, and display element 43 is extinguished.

The color control inputs B, P, BG, G, Y, W, R are applied to the inputs of three 4-input OR gates 61a, 61b, and 61c, whose outputs respectively drive non-inverting buffers 62a, 62b, 63c. Color control R is applied directly to the input of OR gate 61a; color control input G is applied directly to the input of OR gate 61b; color control input B is applied directly to the input of OR gate 61c. Color control input Y is applied simultaneously to the inputs of both OR gates 61a, 61b; color control input BG is applied simultaneously to the inputs of OR gates 61b, 61c; color control input P is applied simultaneously to the inputs of both OR gates 61a, 61c. Color control input W is applied simultaneously to the inputs of all three OR gates 61a, 61b, 61c.

The operation of 3-primary color 7-segment display element 43 shown in FIG. 3 will be now explained in detail by the example of illuminating a digit '1' in seven different colors. To display decimal number '1', a BCD code 0001 is applied to the inputs A0, A1, A2, A3 of common anode 7-segment decoder 24. The decoder 24 develops low voltage levels at its outputs b, c, to illuminate segments b, c, and high voltage levels at all remaining outputs (not shown), to extinguish all remaining segments.

To illuminate display element 43 in red color, color control input R is raised to a high logic level, while all remaining color control inputs are maintained at a low logic level. As a result, the output of OR gate 61a rises to a high logic level, thereby causing the output of buffer 62a to rise to a high logic level. The current flows from the output of buffer 62a, via red bus 5, red LED 2b, to the output b of decoder 24, and, via red LED 2c, to the output c of decoder 24. As a result, segments b, c illuminate in red color, thereby causing a visual impression of a character '1'. The green LEDs 3b, 3c and blue LEDs 4b, 4c remain extinguished because green bus 6 and blue bus 7 are disabled.

To illuminate display element 43 in green color, color control input G is raised to a high logic level, while all remaining color control inputs are maintained at a low logic level. As a result, the output of OR gate 61b rises to a high logic level, thereby causing the output of buffer 62b to rise to a high logic level. The current flows from the output of buffer 62b, via green bus 6, green LED 3b, to the output b of decoder 24, and, via green LED 3c, to the output c of decoder 24. As a result, segments b, c illuminate in green color.

To illuminate display element 43 in blue color, color control input B is raised to a high logic level, while all remaining color control inputs are maintained at a low logic level. As a result, the output of OR gate 61c rises to a high logic level, thereby causing the output of buffer 62c to rise to a high logic level. The current flows from the output of buffer 62c, via blue bus 7, blue LED 4b, to the output b of decoder 24, and, via blue LED 4c, to the output c of decoder 24. As a result, segments b, c illuminate in blue color.

To illuminate display element 43 in yellow color, color control input Y is raised to a high logic level, while all remaining color control inputs are maintained at a low logic level. As a result, the outputs of OR gates 61a, 61b rise to a high logic level, thereby causing the outputs of buffers 62a, 62b to rise to a high logic level. The current flows from the output of buffer 62a, via red bus 5, red LED 2b, to the output b of decoder 24, and, via red LED 2c, to the output c of decoder 24. The current also flows from the output of buffer 62b, via green bus 6, green LED 3b, to the output b of decoder 24, and, via green LED 3c, to the output c of the decoder 24. As a result of blending light of red and green colors, segments b, c illuminate in substantially yellow color.

To illuminate display element 43 in purple color, color control input P is raised to a high logic level, while all remaining color control inputs are maintained at a low logic level. As a result, the outputs of OR gates 61a, 61c rise to a high logic level, thereby causing the outputs of buffers 62a, 62c to rise to a high logic level. The current flows from the output of buffer 62a, via red bus 5, red LED 2b, to the output b of decoder 24, and, via red LED 2c, to the output c of decoder 24. The current also flows from the output of buffer 62c, via blue bus 7, blue LED 4b, to the output b of decoder 24, and, via blue LED 4c, to the output c of decoder 24. As a result of blending light of red and blue color, segments b, c illuminate in substantially purple color.

To illuminate display element 43 in blue-green color, color control input BG is raised to a high logic level, while all remaining color control inputs are maintained at a low logic level. As a result, the outputs of OR gates 61b, 61c rise to a high logic level, thereby causing the outputs of buffers 62b, 62c to rise to a high logic level. The current flows from the output of buffer 61b, via green bus 6, green LED 3b, to the output b of decoder 24, and, via green LED 3c, to the output c of decoder 24. The current also flows from the output of decoder 62c, via blue bus 7, blue LED 4b, to the output b of decoder 24, and, via blue LED 4c, to the output c of decoder 24. As a result of blending light of green and blue colors, segments b, c illuminate in substantially blue-green color.

To illuminate display element 43 in white color, color control input W is raised to a high logic level, while all remaining color control inputs are maintained at a low logic level. As a result, the outputs of OR gates 61a, 61b, 61c rise to a high logic level, thereby causing the outputs of respective buffers 62a, 62b, and 62c to rise to a high logic level. The current flows from the output of buffer 62a, via red bus 5, red LED 2b, to the output b of decoder 24, and, via red LED 2c, to the output c of decoder 24. The current also flows from the output of buffer 62b, via green bus 6, green LED 3b, to the output b of decoder 24, and, via green LED 3c, to the output c of decoder 24. The current also flows from the output of buffer 62c, via blue bus 7, blue LED 4b, to the output b of decoder 24, and, via blue LED 4c, to the output c of decoder 24. As a result of blending light of red, green, and blue colors, segments b, c illuminate in substantially white color.

Since the outputs of 7-segment decoder 24 may be overloaded by driving a triad of LEDs in parallel in display element 43, rather than a single LED in a monochromatic display, it would be obvious to employ suitable buffers to drive respective color display segments (not shown).

In FIG. 4, red light emitting diode 2e, green light emitting diode 3e, and blue light emitting diode 4e are placed on the base of a segment body 15, which is filled with transparent light scattering material 16. Red LEDs are typically manufactured by diffusing a p-n junction into a GaAsP epitaxial layer on a GaAs substrate; green LEDs typically use a GaP epitaxial layer on a GaP substrate; blue LEDs are typically made from SiC material.

When forwardly biased, light emitting diodes 2e, 3e, and 4e emit light signals of red, green, and blue colors, respectively, which are scattered within transparent material 16, thereby blending the red, green, and blue light signals into a composite light signal that emerges at the upper surface of segment body 15. The color of the composite light signal may be controlled by varying the portions of the red, green, and blue light signals.

To illustrate how the present invention can be utilized in multi-element multicolor display configuration, in FIG. 5 is shown a detail of the interconnection in a 2-primary color 4-digit display. The color control inputs R, Y, and G of all display elements 46a, 46b, 46c, and 46d are interconnected, respectively, and the enable inputs E1, E2, E3, and E4 are used to control the conditions of respective display elements. A high logic level at the enable input E extinguishes the particular display element. A low logic level at the enable input E illuminates the display element in a color determined by the instant conditions of the color control inputs R, Y, and G.

Figure 6:
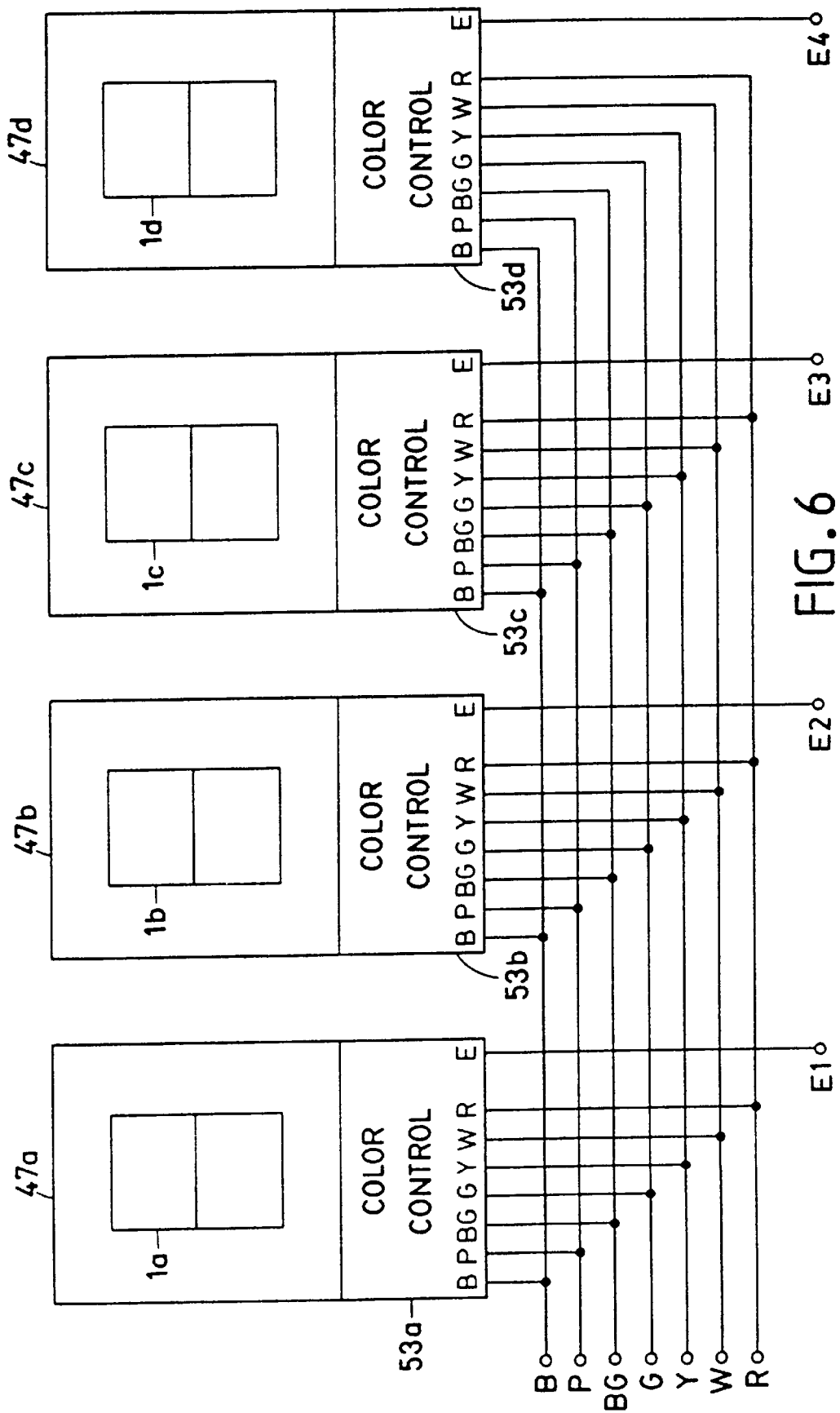
FIG. 6 is a block diagram of a 3-primary color multicolor 4-digit display.

In FIG. 6 is shown a like detail of the interconnection in a 3-primary color 4-digit display. Similarly, the color control inputs B, P, BG, G, Y, W, and R of all display elements 47a, 47b, 47c, and 47d are interconnected. The conditions of respective display elements are controlled by the enable inputs E1, E2, E3, and E4. A high logic level at the enable input E extinguishes the particular display element. A low logic level therein illuminates the display element in a color determined by the instant conditions of the color control logic inputs B, P, BG, G, Y, W, and R.

In brief summary, the invention describes a multi-element display system which includes a plurality of multicolor display element. Each such display element includes a plurality of display areas, for selectively exhibiting a plurality of display units, which in turn include light emitting diodes for emitting light signals of the primary colors. The color of the display unit is controlled by a plurality of color control inputs, for receiving color control logic level signals, which are coupled to the light emitting diodes. Each display element also includes an enable input, for receiving a logic level enable signal, which controls a coupling device, such as a tri-state buffer, interposed between the light emitting diodes and the color control inputs. In response to one condition of the enable signal, the coupling device connects the color control inputs to the light emitting diodes. In response to the opposite condition of the enable signal, the coupling device disconnects the color control inputs from the light emitting diodes. In practice, the color control signals are commonly applied to the respectively interconnected color control inputs, and the enable inputs selects which of the display elements are to be illuminated in a color in accordance with the color control signals.

It would be obvious, in the view of the present disclosure, that other types of gates, or like devices, may be also used in the design of the multicolor display element of the invention. It would be further obvious that the hardware design of the present invention may be also implemented by software. It would be further obvious that persons skilled in the art may resort to modifications in the construction of the preferred embodiment described herein, without departing from the spirit and scope of the invention as defined in the appended claims. It is contemplated that the principles of the invention are also applicable to numerous diverse types of display devices, such as luminescent devices, liquid crystal display devices, plasma display devices, fluorescent display devices, cathode ray tube display devices and the like.

CORRELATION TABLE

This is a correlation table of reference characters used in the drawings herein, their descriptions, and examples of commercially available parts.

| # | DESCRIPTION | EXAMPLE |
|---|---|---|
| 2 | red LED | |
| 3 | green LED | |
| 4 | blue LED | |
| 5 | red bus | |
| 6 | green bus | |
| 7 | blue bus | |
| 15 | segment body | |
| 16 | light scattering material | |
| 23 | common cathode 7-segment decoder | 74LS49 |
| 24 | common anode 7-segment decoder | 74LS47 |
| 42 | multicolor 7-segment display element (2 LEDS) | |
| 43 | multicolor 7-segment display element (3 LEDs) | |
| 46 | one multicolor display character (2 LEDs) | |
| 47 | one multicolor display character (3 LEDs) | |
| 52 | color control (2 LEDs) | |
| 53 | color control (3 LEDs) | |
| 60 | 2-input OR gate | 74HC32 |
| 61 | 4-input OR gate | 4072 |
| 62 | non-inverting buffer | 74LS244 |
| 63 | inverting buffer | 74LS240 |
| 64 | inverter | part of 74LS240,4 |

The parts in the Correlation Table are merely exemplary. It would be obvious to those skilled in the art that other components may be readily and effectively used.

What I claim is:

1. A method for illuminating a multicolor display system which includes a plurality of display elements, each said display element including a plurality of display areas arranged in a pattern for exhibiting, upon selective activation, a plurality of display units, each said display area including a plurality of light emitting diodes for emitting, when forwardly biased, light signals of a plurality of primary colors, respectively, and means for combining said light signals in said display area to obtain a light signal of a composite color, a plurality of enable devices equal in number to the plurality of said display elements and respectively associated therewith, each said enable device including an enable input, for receiving an enable signal of a predetermined value, for allowing said light emitting diodes in said display element to be forwardly biased, each said display element further including a color control input for receiving a color control signal, for illuminating said display element, when enabled by said enable signal, in a color in accordance with said color control signal, the method comprising the steps of:

commonly applying said color control signal to the color control inputs of all said display elements; and selectively presenting said enable signal to said enable input of a certain one of said display elements, for causing it to illuminate a display unit in a color in accordance with said color control signal.

2. A multicolor display system comprising:

a plurality of display elements, each said display element including a plurality of display areas arranged in a pattern for exhibiting, upon selective activation, a plurality of display units, each said display area including a plurality of light emitting diodes for emitting, when forwardly biased, light signals of a plurality of primary colors, respectively, and means for combining said light signals in said display area to obtain a light signal of a composite color, a plurality of enable devices equal in number to the plurality of said display elements and respectively associated therewith, each said enable device including an enable input, for receiving an enable signal of a predetermined value, for allowing said light emitting diodes in said display element to be forwardly biased, each said display element further including a color control input for receiving a color control signal, for illuminating said display element, when enabled by said enable signal, in a color in accordance with said color control signal;

means for commonly applying said color control signal to the color control inputs of all said display elements; and means for selectively presenting said enable signal to said enable input of a certain one of said display elements, for causing it to illuminate a display unit in a color in accordance with said color control signal.

3. A multicolor display system comprising:

a plurality of display elements, each said display element including a plurality of display areas arranged in a pattern for exhibiting, upon selective activation, a plurality of display units, each said display area including a plurality of light emitting diodes for emitting, when forwardly biased, light signals of a plurality of primary colors, respectively, and means for combining said light signals in said display area to obtain a light signal of a composite color, each said display element including a color control input for receiving a color control signal, for illuminating said display unit in a color in accordance with said color control signal;

a plurality of enable devices, equal in number to the plurality of said display elements and respectively associated therewith, for selectively allowing and disallowing said light emitting diodes in said display element to be forwardly biased, each said enable device including an enable input, for receiving an active enable signal, for allowing said light emitting diodes in said display element to be forwardly biased, and an inactive signal, for disallowing said light emitting diodes in said display element to be forwardly biased;

means for commonly applying said color control signal to the color control inputs of all said display elements; and means for selectively presenting said active enable signal to the enable input associated with a certain one of said display elements, for causing it to illuminate said display unit in a color in accordance with said color control signal.

4. A multicolor display system comprising:

plurality of display elements, each said display element including a plurality of display areas arranged in a pattern for exhibiting, upon selective activation, a plurality of display units, each said display area including a plurality of light emitting diodes for emitting, when forwardly biased, light signals of a plurality of primary colors, respectively, and means for combining said light signals in said display area to obtain a light signal of a composite color, each said display element including a plurality of color control inputs for receiving a color control signal, for illuminating said display unit in a color in accordance with a color control input to which said color control signal is applied;

a plurality of enable devices, equal in number to the plurality of said display elements and respectively associated therewith, for selectively allowing and disallowing said light emitting diodes in said display element to be forwardly biased, each said enable device including an enable input, for receiving an active enable signal, for allowing said light emitting diodes in said display element to be forwardly biased, and an inactive signal, for disallowing said light emitting diodes in said display element to be forwardly biased;

means for respectively interconnecting the color control inputs of all said display elements;

means for selectively applying said color control signal to the interconnected color control inputs; and means for selectively presenting said active enable signal to the enable input associated with a certain one of said display elements, for causing it to illuminate said display unit in a color in accordance with said color control signal.

5. A multicolor display system comprising:

a plurality of display elements, each said display element including a plurality of display areas arranged in a pattern for exhibiting, upon selective activation, a plurality of display units, each said display area including a first light emitting diode for emitting, when forwardly biased, light signals of a first primary color, a second light emitting diode for emitting, when forwardly biased, light signals of a second primary color, and means for combining said light signals in said display area to obtain a light signal of a composite color, each said display element including a first color control input, for receiving a color control signal for illuminating said display unit in said first primary color, a second color control input, for receiving a color control signal for illuminating said display unit in said second primary color, and a third color control input, for illuminating said display unit in said composite color;

a plurality of enable devices, equal in number to the plurality of said display elements and respectively associated therewith, for selectively allowing and disallowing said light emitting diodes in said display element to be forwardly biased, each said enable device including an enable input, for receiving an active enable signal, for allowing said light emitting diodes in said display element to be forwardly biased, and an inactive signal, for disallowing said light emitting diodes in said display element to be forwardly biased;

means for respectively interconnecting said first color control inputs, said second color control inputs, and said third color control inputs of all said display elements;

means for selectively applying said color control signal to the interconnected color control inputs; and means for selectively presenting said active enable signal to the enable input associated with a certain one of said display elements, for causing it to illuminate said display unit in a color in accordance with said color control signal.

6. A multicolor display system comprising:

a plurality of display elements, each said display element including a plurality of display areas arranged in a pattern for exhibiting, upon selective activation, a plurality of display units, each said display area including a first light emitting diode for emitting, when forwardly biased, light signals of a first primary color, a second light emitting diode for emitting, when forwardly biased, light signals of a second primary color, a third light emitting diode for emitting, when forwardly biased, light signals of a third primary color, and means for combining said light signals in said display area to obtain a light signal of a composite color, each said display element including a first color control input, for receiving a color control signal for illuminating said display unit in said first primary color, a second color control input, for receiving a color control signal for illuminating said display unit in said second primary color, a third color control input, for illuminating said display unit in said third primary color, a fourth color control input, for receiving a color control signal for illuminating said display unit in a first composite color, a fifth color control input, for receiving a color control signal for illuminating said display unit in a second composite color, a sixth color control input, for illuminating said display unit in a third composite color, and a seventh color control signal, for illuminating said display unit in a fourth composite color;

a plurality of enable devices, equal in number to the plurality of said display elements and respectively associated therewith, for selectively allowing and disallowing said light emitting diodes in said display element to be forwardly biased, each said enable device including an enable input, for receiving an active enable signal, for allowing said light emitting diodes in said display element to be forwardly biased, and an inactive signal, for disallowing said light emitting diodes in said display element to be forwardly biased;

means for respectively interconnecting said first color control inputs, said second color control inputs, said third color control inputs, said fourth color control inputs, said fifth color control inputs, said sixth color control inputs, and said sevenths color control inputs of all said display elements;

means for selectively applying said color control signal to the interconnected color control inputs; and means for selectively presenting said active enable signal to the enable input associated with a certain one of said display elements, for causing it to illuminate said display unit in a color in accordance with said color control signal.

* * * * *